United States Patent [19]

Brewer

[11] 3,815,124

[45] June 4, 1974

[54] ANALOG TO DIGITAL CONVERTER

[75] Inventor: Joe E. Brewer, Severna Park, Md.

[73] Assignee: Westinghouse Electric Corporation, Pittsburgh, Pa.

[22] Filed: Jan. 16, 1973

[21] Appl. No.: 324,455

[52] U.S. Cl. ...... 340/347 AD, 179/15.55, 325/38 R
[51] Int. Cl. ........................................ H03k 13/02
[58] Field of Search.. 340/347 AD; 325/38 R, 38 B; 179/15.55; 332/11 R

[56] References Cited

UNITED STATES PATENTS

| | | | |
|---|---|---|---|
| 3,311,910 | 3/1967 | Doyle | 340/347 AD |
| 3,384,889 | 5/1968 | Lucas | 340/347 AD |
| 3,471,648 | 10/1969 | Miller | 179/15.55 |
| 3,471,644 | 10/1969 | Gold et al. | 325/38 RX |
| 3,483,550 | 12/1969 | Max | 340/347 AD |
| 3,500,247 | 3/1970 | Sekimoto et al. | 332/11 R |
| 3,597,761 | 8/1971 | Fraschilla et al. | 340/347 AD |
| 3,688,221 | 8/1972 | Fruhalf | 325/38 B X |
| 3,721,975 | 3/1973 | Brinkman et al. | 340/347 AD |

*Primary Examiner*—Charles D. Miller
*Attorney, Agent, or Firm*—J. B. Hinson

[57] ABSTRACT

An electronic analog to digital converter which samples and quantizes an analog signal in two signal channels respectively providing digital words corresponding to the envelope of the analog input signal and an amplitude normalized analog signal. The normalized or waveform signal defines the waveform structure which contains the analog signal frequency components above that contained in the envelope signal. The envelope digital word for a given time sample multiplied by the waveform digital word for that same time sample provides a digital word corresponding to the analog input signal.

9 Claims, 8 Drawing Figures

| LEVEL DETECTION SIGNALS | | | | | | | WAVEFORM WORD | | | | STATE |
|---|---|---|---|---|---|---|---|---|---|---|---|
| $\overline{>0}$ | $\overline{>1}$ | $\overline{>2}$ | $\overline{>3}$ | $\overline{>4}$ | $\overline{>5}$ | $\overline{>6}$ | W3 | W2 | W1 | W0 | |
| 0 | 0 | 0 | 0 | 0 | 0 | 0 | 0 | 1 | 1 | 1 | 7 |
| 0 | 0 | 0 | 0 | 0 | 0 | 1 | 0 | 1 | 1 | 0 | 6 |
| 0 | 0 | 0 | 0 | 0 | 1 | 1 | 0 | 1 | 0 | 1 | 5 |
| 0 | 0 | 0 | 0 | 1 | 1 | 1 | 0 | 1 | 0 | 0 | 4 |
| 0 | 0 | 0 | 1 | 1 | 1 | 1 | 0 | 0 | 1 | 1 | 3 |
| 0 | 0 | 1 | 1 | 1 | 1 | 1 | 0 | 0 | 1 | 0 | 2 |
| 0 | 1 | 1 | 1 | 1 | 1 | 1 | 0 | 0 | 0 | 1 | 1 |
| 1 | 1 | 1 | 1 | 1 | 1 | 1 | X | 0 | 0 | 0 | 0 |
| 0 | 1 | 1 | 1 | 1 | 1 | 1 | 1 | 1 | 1 | 1 | -1 |
| 0 | 0 | 1 | 1 | 1 | 1 | 1 | 1 | 1 | 1 | 0 | -2 |
| 0 | 0 | 0 | 1 | 1 | 1 | 1 | 1 | 1 | 0 | 1 | -3 |
| 0 | 0 | 0 | 0 | 1 | 1 | 1 | 1 | 1 | 0 | 0 | -4 |
| 0 | 0 | 0 | 0 | 0 | 1 | 1 | 1 | 0 | 1 | 1 | -5 |
| 0 | 0 | 0 | 0 | 0 | 0 | 1 | 1 | 0 | 1 | 0 | -6 |
| 0 | 0 | 0 | 0 | 0 | 0 | 0 | 1 | 0 | 0 | 1 | -7 |

ANALOG TO DIGITAL CONVERTER

BACKGROUND OF THE INVENTION

1. Field of the Invention

The present invention relates to electrical signal processing apparatus and more particularly to an analog to digital converter which transforms an analog input signal into a digital format.

2. Description of the Prior Art

The availability of standard, off-the-shelf, functional building blocks such as the MSI and LSI families of digital circuits has made digital signal processing a practical undertaking for a wide variety of systems where analog signals are available. The organization of such processors normally involves some sort of time sampling of the analog signal followed by analog to digital (A/D) conversion. Usually the digitally quantized result will be stored in some type of memory which can then be utilized for subsequent data processing.

The present invention is directed to an A/D converter which reduces the demands made upon the electronic circuitry with regard to required word sizes and conversion rates resulting in great economic advantages. The present state of the art of analog to digital conversion apparatus performs what is referred to as a direct quantization in a single signal channel which includes the functions of sampling, quantizing and usually an implicit zero order hold, whereupon the incoming signal is represented by a single output sequence of digital numbers at each sampling time with sampling occurring at fixed time intervals. The implicit zero hold exists if the digital processor assumes that the signal level remains fixed between discrete sample times. In a direct quantization system, one digital word represents the signal at a given sample time, with the word containing both magnitude and sign information. The sampling rate (Nyquist) must be sufficiently high to satisfy the sampling theorem while the word size is determined by the desired resolution and expected signal dynamic range.

For example the conversion of an analog signal having a bandwidth from say, 1KHz to 100KHz into a 13 bit digital word (12 magnitude bits and one sign bit) at a 250KHz sampling rate is not only difficult to implement in terms of present day technology, but conversion speed and price are directly related variables. In many applications word sizes and conversion rates are required beyond that which off-the-shelf monolithic integrated circuit components can achieve.

SUMMARY

Briefly, the subject invention comprises a two-channel converter which effectively separates an analog input signal into two component signals, an envelope signal and a waveform (amplitude normalized) signal which are then A/D converted in separate channels. The envelope signal follows the large dynamic variations of the analog signal, but in so doing is limited to slowly varying frequency components. The highest envelope frequency will generally be one or two orders of magnitude below the frequency content in the input signal. The waveform signal on the other hand is developed from a ratio of the analog input signal to a time sampled magnitude of the envelope signal and comprises an amplitude normalized signal containing the analog signal frequency components above that in the envelope signal.

The envelope channel includes an envelope detector followed by a successive approximation envelope word A/D converter whereas the waveform channel includes signal normalizer circuitry which develops the ratio of the amplitude of the analog input signal to a time sampled amplitude of the envelope signal followed by second A/D conversion means. Additionally, a full wave rectifier is provided at the input to both the envelope detector and the signal normalizer in order to ease the design problems associated with the envelope detector and to simplify the waveform word A/D conversion.

The two channel configuration has the advantage of the elimination of the simultaneous requirement for a large digital word size as well as a rapid conversion rate. By this is meant that the circuitry utilized for the envelope A/D conversion utilizes a word size equal to that of a single channel converter but operates at a conversion rate relatively slower than the heretofore direct conversion approach. The apparatus utilized for the waveform signal A/D conversion although requiring the same conversion rate as the direct method, the word size required is relatively lower. Each channel provides separate digital output envelope words and waveform words, respectively, which can, when desired, be multiplied together to provide a digital representation of the analog input signal.

DESCRIPTION OF THE PREFERRED EMBODIMENT

Figure 1:
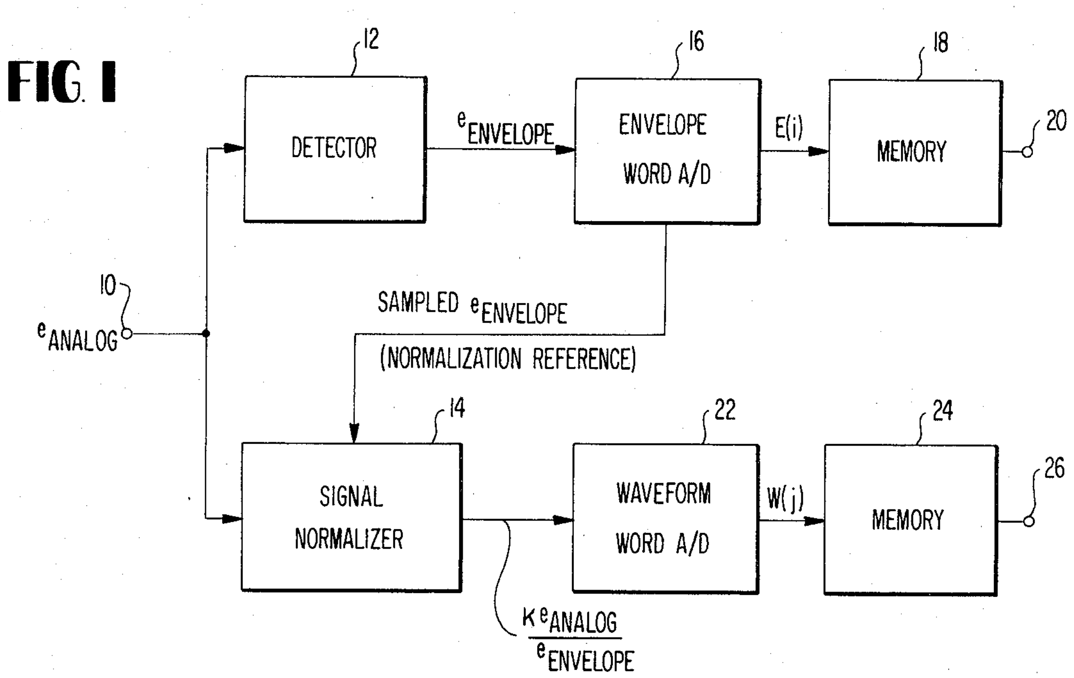
FIG. 1 is an electrical block diagram broadly illustrative of the subject invention.

Referring now to the drawings and more particularly to FIG. 1, the block diagram discloses a two channel configuration for generating an envelope digital word in one channel and a waveform or amplitude normalized digital word in the other channel. Reference numeral 10 in FIG. 1 comprises an input terminal to which is applied the analog input signal $e_{analog}$. This input signal is simultaneously applied to a detector circuit 12 preferably an envelope detector and a signal normalizer circuit 14 which additionally receives a normalization reference signal corresponding to a time sampled envelope amplitude provided by a portion of envelope word A/D conversion circuit 16 which receives as its input the output of the envelope detector 12. The A/D converter apparatus 16 generates a digital output word E(i) which is coupled into a digital memory 18 having an output terminal 20. The signal normalizer circuit provides an output signal which is an amplitude normalized signal proportional to the ratio of $e_{analog}/e_{envelope\ (sampled)}$. The normalized signal comprises a waveform signal which is converted into a digital word W(j) by means of a second or waveform word A/D converter means 22 which digital word W(j) is fed into a respective digital memory 24 having an output terminal 26.

Before proceeding to a consideration of a more detailed description of the present invention, a few general considerations regarding the selection of sample rates, the relationship between sample rates and memory parameters, and the response of the subject A/D converter during amplitude changes will be considered. The primary criteria for sample rate selection is, of course, derived from the particular application. Considering for example a signal bandwidth of an analog input signal being from 1KHz to 100KHz, the waveform channel must have a sample rate high enough to process the highest frequency in the band. By the sampling theorem a rate higher than 200KHz must be used in order to avoid loss of information. The envelope channel sampling rate, however, need only be high enough to treat the highest frequency out of the detector circuit. This rate must be examined from the viewpoint of the amount of envelope amplitude change that can occur between samples and the possible saturation of the waveform channel. Additionally, sampling rates for the envelope word channel and the waveform word channel should be selected to facilitate memory addressing. Each digital envelope word moreover is related or paired with several waveform words. For example, 32 digital waveform words could be paired with one envelope word.

The phenomena taking place in the two channels during periods of change of signal amplitude should also be considered. Typical situations of interest are the leading and trailing edges of a burst of electromagnetic energy or the audio signal resulting from an explosive sound source. During a period of amplitude change, the envelope signal attempts to follow the change and via the normalization process, keep the waveform word within the dynamic range of the waveform A/D conversion channel. If for any reason the envelope word does not correspond to the mathematical envelope of the incoming signal, i.e. exactly following the input envelope, the amplitude of the normalized waveform will compensate such that the product of the E(i) and W(j) word pair still correspond to the incoming signal.

Figure 2:
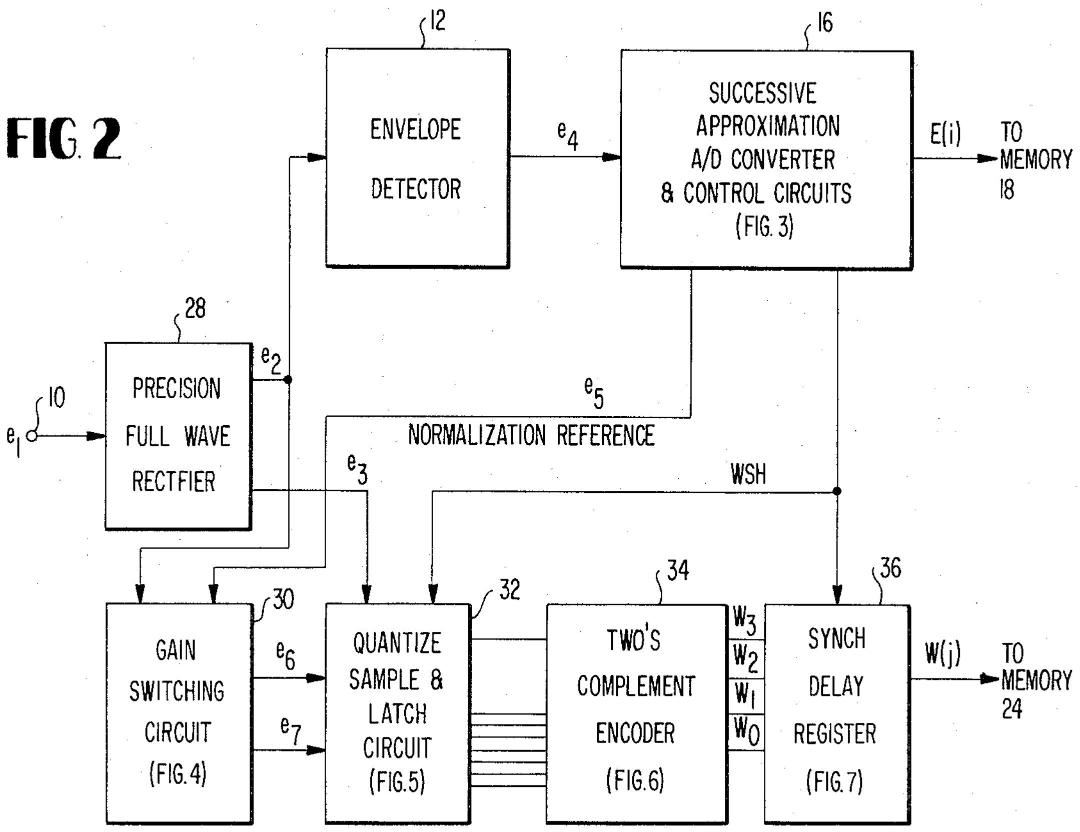
FIG. 2 is a more detailed block diagram, being illustrative of the preferred embodiment of the subject invention.

Bearing the foregoing considerations in mind, reference is now made to FIG. 2 which discloses what is at present considered to be the preferred embodiment of the subject invention, providing additional circuit details not included in FIG. 1. A precision full wave rectifier 28 is additionally included immediately following the input terminal 10 in order to ease the design problems associated with the envelope detector 12 and because it simplifies the waveform A/D conversion. The signal $e_1$ corresponds to the analog input signal shown in FIG. 1. The rectifier circuit 28 provides in addition to a rectified signal $e_2$ of the input signal $e_1$ a second rectified output signal $e_3$ indicative of the polarity or sign of the input signal $e_1$. The rectified analog signal $e_2$ is applied to the envelope detector 12 which develops an analog envelope signal $e_4$ which in turn is applied to a successive approximation A/D converter 16 as discussed previously with respect to FIG. 1. The waveform word channel of the configuration shown in FIG. 2 now includes a gain switching circuit 30 receiving the rectified analog signal $e_2$ from the rectifier 28 and a time sampled envelope voltage amplitude $e_5$ from the A/D converter 16 which operates as a reference for normalization. A quantize, sample and latch circuit 32 is next coupled to the gain switching circuit 30 receiving therefrom an analog input signal $e_6$ corresponding to a gain modified version of the signal $e_2$ and a reference signal $e_7$ which corresponds to a gain modified version of the signal $e_5$. Also, the polarity signal $e_3$ is applied thereto from the rectifier 28. The circuitry 32 feeds into a digital encoder 34 being in the form of a two's complement encoder 34. The output of the encoder 34 comprises four digital signal bits W0, W1, W2 and W3 in the two's complement format which is then applied to a synch delay register 36.

The envelope detector 12 and the precision full wave rectifier 28 are conventional circuits well known to those skilled in the art. The envelope detector 12 need only have a time constant long enough to accurately define the envelope, but at the same time be sufficiently short to allow for signal decay within a reasonable period of time. Some ripple signal between peaks is unavoidable; however, little problem will exist for rising signals such as the leading edge of a signal burst. The envelope detector 12 will follow all signals within the pass band to the peak voltage with a negligible time lag. Between signal peaks, and for falling signals such as the trailing edge of a burst, the detector output will not correspond exactly to the mathematical envelope. The envelope signal $e_4$, however, does not have to correspond to the mathematical envelope for the configuration shown in FIG. 2 to operate as intended. The envelope signal $e_4$ needs only to provide a reasonably representative estimate of the input signal amplitude so that the dynamic range of the normalized waveform signal $e_6$ will be small. As noted earlier, the product of the waveform digital word and the envelope digital word will accurately represent the input signal $e_1$ even when the envelope signal $e_4$ departs from the mathematical envelope.

Figure 3:
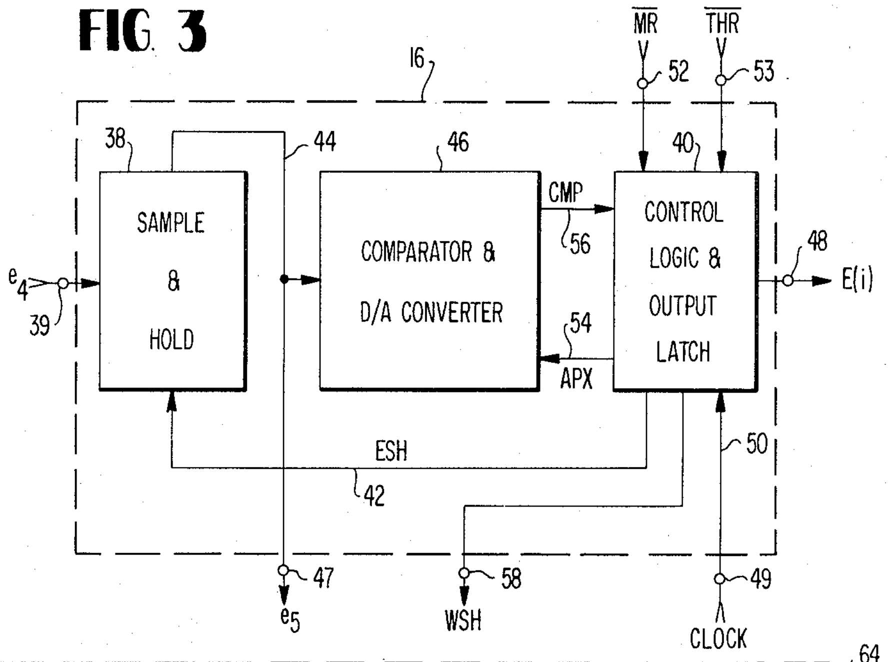
FIG. 3 is a block diagram illustrative of a successive approximation A/D converter utilized for the envelope signal channel shown in FIG. 2.

The successive approximation A/D converter 16 again is a well known data processing circuit. It, however, is shown for purposes of illustration in greater detail in the block diagram of FIG. 3. The D/A converter of FIG. 3 is comprised of a sample and hold circuit 38 which is adapted to receive the analog signal $e_4$ at terminal 39, being representative of the envelope of the input signal $e_1$. The sample and hold circuit 38 periodically samples the analog signal $e_4$ in response to an envelope sample control signal ESH applied thereto from a control logic and output latch circuit 40 by means of a circuit lead 42. The instantaneous sampled envelope amplitude level appears on circuit lead 44 which is simultaneously applied to a comparator and D/A converter unit 46 and to the gain switching circuit 30 shown in FIG. 2, by means of terminal 47, thereby comprising the normalized reference signal $e_5$. The circuitry 46 operates in conjunction with the control logic and output latch circuitry 40 to provide the digital envelope word E(i) at output terminal 48. The control logic and output latch circuitry 40 operates in response to a clock signal CLOCK applied from a timing signal source, not shown, to terminal 49. The circuitry moreover receives a master reset input signal $\overline{MR}$ applied to terminal 52 in order to control the envelope word E(i) output during the power up sequence when power to the apparatus is first turned on. Secondly, a logic input signal $\overline{THR}$ IS APPLIED TO TERMINAL for blanking the A/D converter output for invalid signals resulting from a testing of the incoming signals against threshold criteria involving frequency, duration and amplitude which is provided in most signal processing systems, which testing is normally provided ahead of the circuitry embodying the subject invention. The control logic and output latch circuitry 40 generates a digital approximation word APX which is coupled back to the comparator and D/A converter circuitry 46 by means of circuit lead 54 which approximation word is converted to an analog signal and compared against th analog signal appearing on circuit lead 44 with the error signal CMP therebetween being coupled back to the control logic and output latch circuitry 40 by means of the circuit lead 56. The successive approximation operation thus typically involves comparing the output digital word generated against the analog input until the comparison signal fed back to the digital output circuitry is reduced to a predetermined level.

This is exactly what happens with the circuitry shown in FIG. 3. Additionally, the control logic and output latch circuitry 40 provides an enabling control signal WSH for the waveform word channel at terminal 58 to the quantize, sample and latch circuit 32 (FIG. 5) and the synch delay register 36 (FIG. 7) for synchronizing the digital envelope word E(i) with the digital waveform word W(j).

Figure 4:
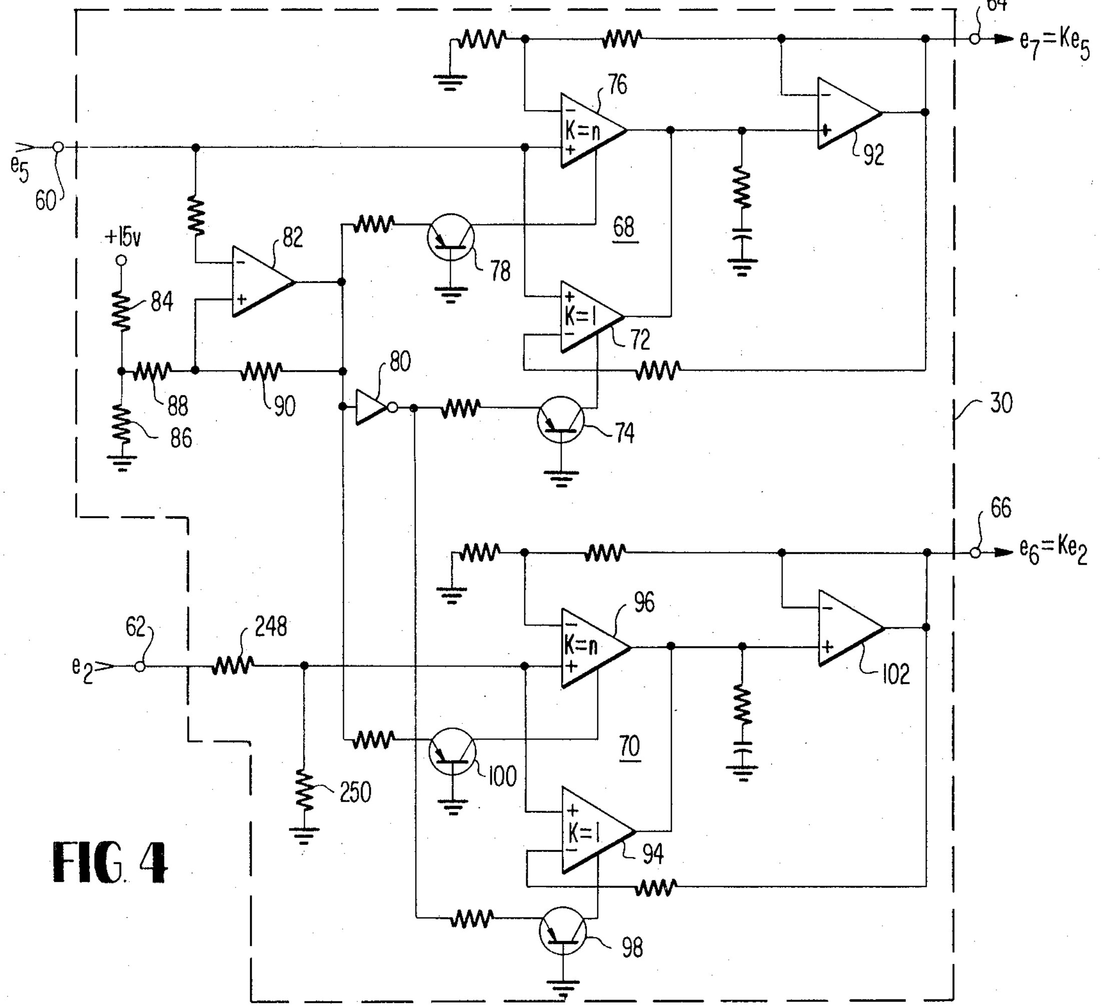
FIG. 4 is an electrical schematic diagram illustrative of the gain switching circuit utilized in the waveform signal channel of the block diagram shown in FIG. 2.

Considering now the waveform word channel in greater detail, reference is first made to the gain switching circuit 30 shown in FIG. 4. This circuit has the purpose of maintaining a reasonable input voltage level for the quantizer circuitry to be discussed when reference is made to FIG. 5. FIG. 4 includes a pair of input terminals 60 and 62 and a pair of output terminals 64 and 66. The sampled envelope analog signal $e_5$ from THR is applied to terminal 53 for and hold circuit 38 (FIG. 3) of the successive approximation A/D converter 16 is applied to input terminal 60. The rectified analog input signal $e_2$ from the rectifier 28 is applied to input terminal 62. The circuit configuration shown in FIG. 4 comprises two separate gain switching circuits 68 and 70 of like characteristics, one for the sampled envelope signal $e_5$ and one for the analog signal $e_2$. The gain switching circuit 68 includes a unity gain amplifier 72 enabled the disabled by means of a common base transistor switch 74, and a parallel connected ($K=n$) amplifier 76 adapted to be enabled and disabled by the common base transistor switch 78. The transistor switches 74 and 78 are coupled to the output of a logic inverter 80 and to the output of a comparator amplifier 82 respectively. The comparator 82 receives as one input the sampled envelope voltage $e_5$ coupled to input terminal 60 while the second input is comprised of a fixed reference voltage established by the resistors 84, 86, 88 and 90. The amplifiers 72 and 76 have their common outputs connected to a buffer amplifier 92 whose output is connected to output terminal 64.

In operation, when the amplitude of the sampled envelope voltage $e_5$ is above a certain level, the $K=n$ amplifier 76 is disabled and the unity gain amplifier 72 is enabled; however, when the amplitude falls below this predetermined level, amplifier 76 will become enabled while amplifier 72 reverses its state and becomes disabled. The same operation occurs with respect to the gain switching circuit 70 which includes a unity gain amplifier 94 and a ($K=n$) amplifier 96 respectively controlled by transistor switches 98 and 100. As in the circuit above, the transistor switch 98 is coupled to the output of the logic inverter 80 whereas the transistor switch 100 is coupled to the output of the comparator 82. The gains of amplifiers 76 and 96 are substantially identical and it can be seen that both are either simultaneously operative or inoperative and therefore the gain of the analog signal $e_2$ is varied simultaneously with the gain of the sampled envelope signal $e_5$. In a like manner, the outputs of the amplifiers 94 and 96 are coupled in parallel to a buffer amplifier 102 which has its output coupled to output terminal 66. Accordingly, output terminals 64 and 66 respectively provide a reference DC analog signal $e_7 = K e_5$ while output terminal 66 provides an analog DC signal $e_6 = K e_2$ where $K$ is equal to 1 or $n$.

Figure 5:
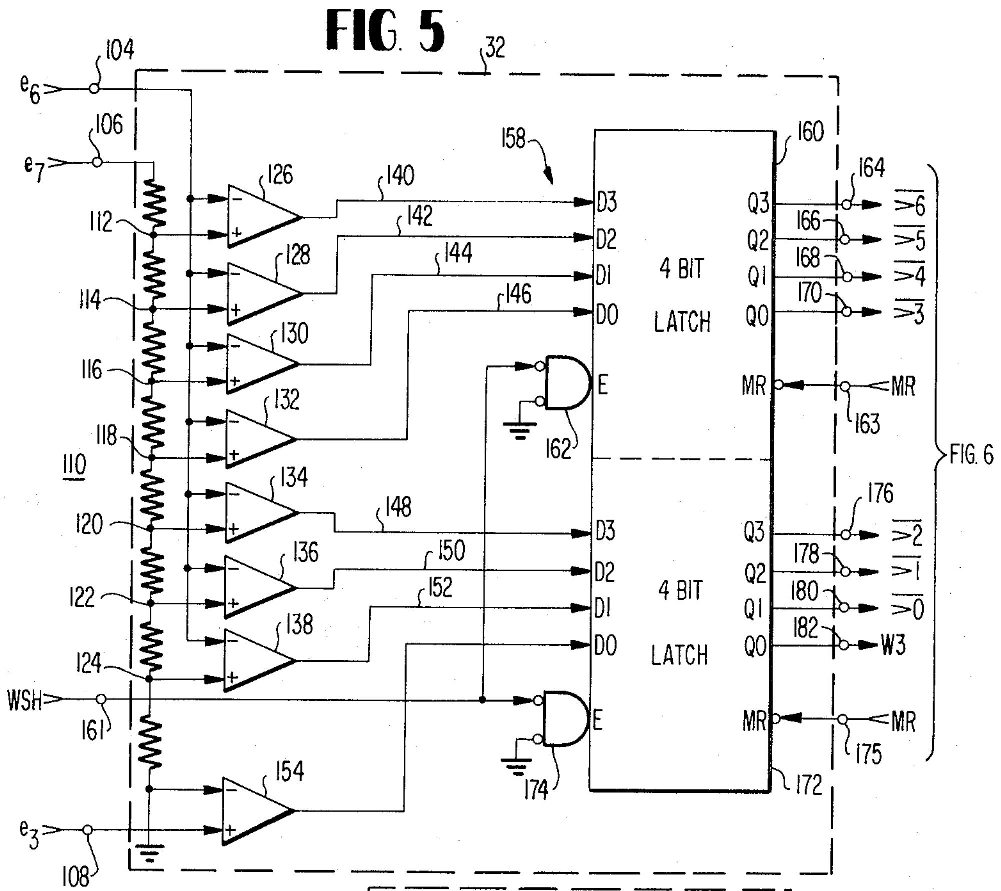
FIG. 5 is an electrical schematic diagram of a quantize, sample and latch circuit shown in block diagrammatic form in FIG. 2.
Figure 6:
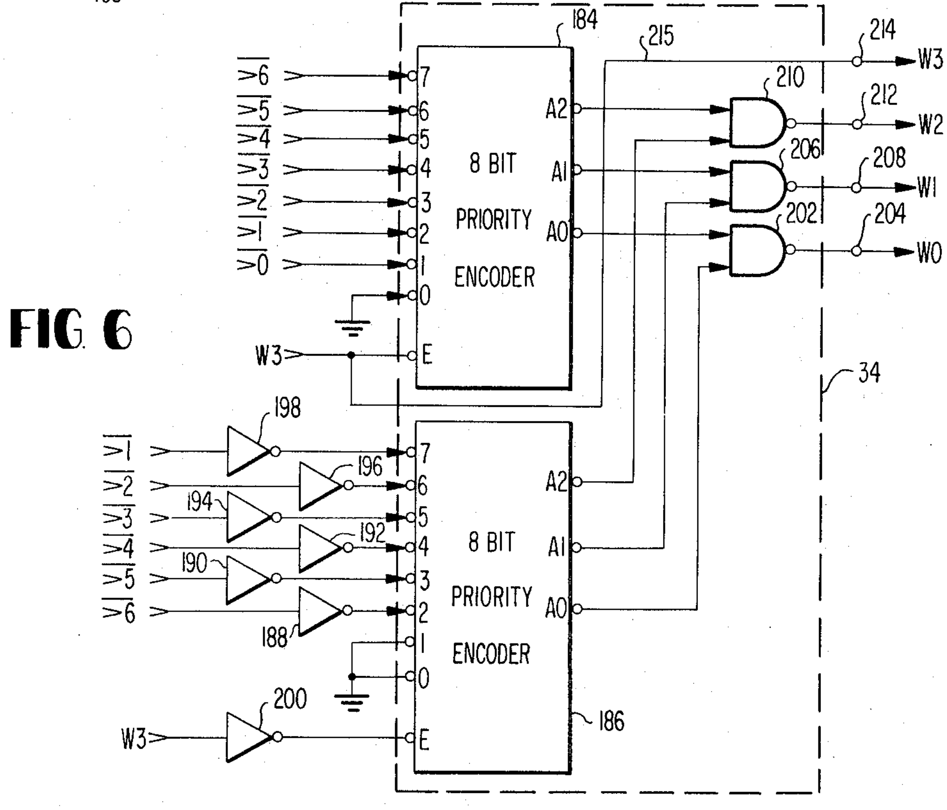
FIG. 6 is an electrical schematic diagram of the two's complement word encoder shown in block diagram in FIG. 2.

Proceeding further, reference is now made to FIG. 5 wherein input terminals 104, 106 are coupled to terminals 66 and 64 of FIG. 4 while a DC signal indicative of the polarity is supplied from the rectifier 28 to terminal 108. The DC analog normalization reference signal $e_7$ is applied to input terminal 106 and is coupled to a resistor voltage divider network 110 having seven reference voltage level terminals 112, 114, 116, 118, 120, 122 and 124. The voltage level terminals 112 . . . 124 respectively couple into a like terminal of seven comparator amplifiers 126, 128, 130, 132, 134, 136 and 138, each having as the other input thereto the DC analog signal $e_6$ which is applied to input terminal 104, thus providing seven digital signals which appear on circuit leads 140, 142, 144, 146, 148, 150 and 152. An eighth comparator amplifier 154 on the other hand has one input coupled to ground or zero potential while the other input is coupled to input terminal 108 to which is applied the polarity signal $e_3$ for generating the sign bit. The voltage divider network 110 and the comparators 126 . . . 138, and 154 measure and quantize the ratio of instantaneous value of the analog waveform signal $e_6$ to fractional parts of the referene signal $e_7$ as well as the polarity thereof. An eight bit latch circuit 158 which may be comprised of a dual four bit latch module manufactured by Fairchild Semiconductor and identified as type 9308 samples and stores the quantizer output. The first four output leads 140, 142, 144 and 146 from the comparators 126, 128, etc. feed into the upper four bit latch 160 at the pins D3, D2, D1 and D0. The latch is enabled through an AND gate 162 associated therewith which receives a waveform word sample control signal WSH from the control logic and output latch circuit 40 shown in FIG. 3 at terminal 161. Also a reset signal MR is adapted to be applied at the pin MR through terminal 163. Pins Q3, Q2, Q1 and Q0 of the four bit latch 160 provides outputs corresponding to $>\bar{6}$, $>\bar{5}$, $>\bar{4}$ and $>\bar{3}$, respectively at terminals 164, 166, 168 and 170. The second four bit latch 172 has identical pin numbers and an enabling AND gate 174 which is also adapted to receive the enabling signal WSH from terminal 161 as well as a reset signal MR applied to terminal 175. The output pins Q3, Q2, Q1 and Q0 of the latch 172, however, provides outputs corresponding to the levels $\overline{>2}$, $\overline{>1}$, $\overline{>0}$ and W3, respectively, at terminals 176, 178, 180 and 182 where W3 indicates polarity or sign.

The output signals $\overline{>6}$, $\overline{>5}$, . . . $\overline{>0}$, and W3 from the latches 160 and 172 are coupled to two eight input priority encoders 184 and 186 which encoders typically comprise type 9318 encoders manufactured by Fairchild Semiconductor. More particularly, output signals $\overline{>6}$, $\overline{>5}$, . . . W3 are coupled to pins 7, 6, . . . E respectively of encoder 184. With respect to encoder 186, however, output signals $\overline{>6}$, $\overline{>5}$ . . . W3 with the exception $\overline{>0}$ are coupled to pins 2, 3, . . . E through logic inverters 188, 190, . . . 200. The A0 output pins of the encoders 184 and 186 are coupled to a NAND gate 202 which provides an output bit W0 of a four bit word at terminal 204. The second bit W1 is formed by the A1 output pins of the encoders 184 and 186 being fed to the NAND gate 206 coupled to output terminal 208. In a similar fashion, output pins A2 of the encoders 184 and 186 are fed to the NAND gate 210 providing the bit W2 at output 212. The fourth bit W3 constitutes the sign bit and appears at terminal 214 which is connected back to the Q0 output pin of the latch 172 by means of circuit lead 215.

Figures 7, 8:
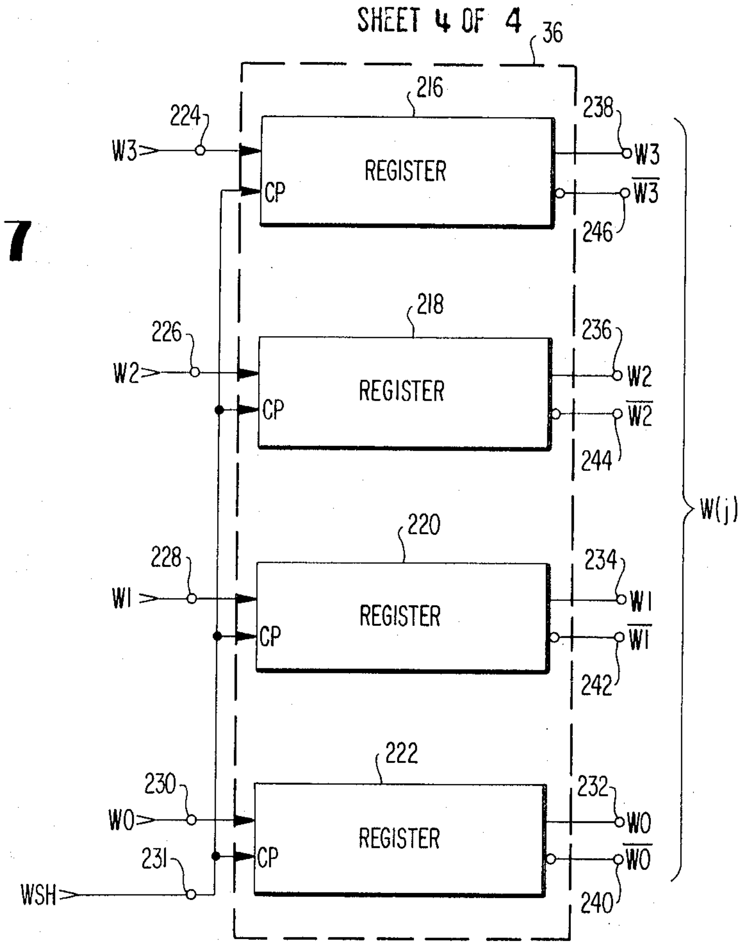
FIG. 7 is an electrical schematic diagram of the synch delay register shown by the block diagram in FIG. 2.
FIG. 8 is a tabulation illustrative of the quantizer level and the truth table for the two's complement encoder.

The two's complement digital word W0, W1, W2, W3 is next fed into a synchronization delay register 36 as shown in FIG. 7. Reference numerals 216, 218, 220 and 222, respectively receive the digital word bits W3, W2, W1, and W0, at the input terminals 224, 226, 228 and 230. The waveform word sample control signal WSH from the control logic and output latch circuit 40 shown in FIG. 3 is also applied to the synch input terminals CP of the registers 216, . . . 222 at terminal 231 whereupon the encoded word W0, W1, W2, 3 making up the envelope word W(j) appears at terminals 232, 234, 236 and 238, respectively. The complementary output $\overline{W0}$, $\overline{W1}$, $\overline{W2}$ and $\overline{W3}$ appears at terminals 240, 242, 244 and 246.

The Truth Table shown in FIG. 8 illustrates the operation of the A/D conversion of the normalized signal. The tabulation indicates the seven levels $\overline{>0}$, $\overline{>0_1}$ . . . $\overline{>0_6}$ in the four bit digitally encoded waveform word for both a positive and a negative polarity analog input signal. Envelope signal lag for rising signals is a point of concern during design of the subject invention. Two reasons exist for such lags: The envelope detector circuit 12 can provide only an approximation to the mathematical envelope and the mathematical envelope is changing between envelope word samples. It happens that the detector will follow rising signals with negligible delay but it does exhibit droop between signal peaks. Signal change between envelopes signal samples is thus a major factor which can cause A/D saturation of the waveform channel. The waveform channel will be saturated for one or two sample intervals, but will be performing properly after three or more envelope samples $e_5$. The loss of signal fidelity for one or two envelope's sample intervals at the beginning of a long input signal is of no substantial consequence. However, rises in envelope amplitude also occur at points other than at the leading edge and provision must be made to avoid driving the waveform A/D channel beyond full scale. The design of the waveform A/D channel anticipates this requirement by using an offset scale. When the ratio of the waveform sample to the envelope sample is unity, a waveform word W(j) something less than full scale is generated. This is achieved by a small amount of attenuation, e.g., 6/7 provided by the resistors 248 and 250 shown in FIG. 4. As noted above, the binary waveform word out of the comparators 126, 128, 130, 132, 134, 136 and 138 shown in FIG. 5 is a numeric representation proportional to the ratio of the instantaneous signal voltage $e_2$ to the sampled envelope voltage $e_5$ and when the waveform word is a binary 6, the ratio is unity. Full scale output is binary 7 therefore the instantaneous voltage can rise above the sampled value of the envelope without saturating the waveform quantizer shown in FIG. 5.

As noted above, each envelope word E(i) is related or paired with several waveform words W(j). For example, thirty-two waveform words may be paired with one envelope word. Thus the envelope sample interval divided by the waveform sample interval must be an integer. When corresponding E(i) and W(j) digital words are to be extracted from respective memories, the integer relationship between sample times is important. Accordingly, word W(j) is paired with word $E(nj/32)$ in the cited example. The relationships between the sample rates and the memory parameters are stated in terms of an integer relationship between sample intervals and therefore it is very convenient if that integer is equal to some numeral $2^n$.

Thus while the envelope word channel will accurately follow rising signals with negligible delay, the waveform word channel will provide an output responsive to rapid changes in the analog waveform and the product of the envelope word E(i) and the waveform word W(j) will accurately represent the input signal even when there is some departure from the mathematical envelope of the input signal.

When desirable the envelope detection function can be accomplished by an averaging detector instead of a peak detector. The normalization reference signal and the envelope word must then be adjusted by a multiplication factor to estimate the envelope magnitude.

One significant advantage of the suject approach to analog to digital conversion is that for a direct conversion signal processor, the memory requirement is at least three times the memory requirement of the subject invention. In addition, a $700 to $1,000.00 A/D signal processor can be replaced by two units having less stringent requirements for a combined cost of less than $300.00.

Thus the subject invention rectifies the analog input signal $e_1$ to provide a DC signal $e_2$ which is split into two signal paths and applied first to the envelope channel including the envelope detector 12 and the successive approximation A/D converter 16 which in addition to generating the envelope digital word E(i) is also adapted to provide a sampled envelope signal $e_5$ and a control signal WSH for control and synchronization. The signal $e_2$ is secondly applied to a parallel waveform channel which normalizes the input signal $e_2$ following a gain switching stage 30 and an amplitude converter and latch 32 whereupon a two's complement encoder 34 develops a four bit digital word W0 . . . W3 which is applied to a synch delay register 36 so that a time related digital waveform word W(j) can be provided together with E(i) which by multiplying the two together provides a digital representation of the input signal $e_1$.

Having thus described what is at present considered to be the preferred embodiment of the subject invention, I claim as my invention:

1. A dual channel analog to digital signal converter comprising in combination:

input signal means coupled to an analog input signal and providing two separate channel signal paths;

circuit means responsive to the envelope of said analog input signal, coupled to one signal path and providing an envelope signal;

first analog to digital conversion means coupled to said circuit means and being responsive to said envelope signal to provide a time sampled portion of said envelope signal and a first digital output word substantially corresponding to said envelope signal, and additionally including control circuit means providing a timing control signal for synchronously operating a second analog to digital converter at predetermined sampling time intervals;

gain switching circuit means coupled to the other signal path and said first analog to digital conversion means, receiving a respective input therefrom of said analog input signal and said time sampled portion of said envelope signal and being operable to simultaneously change the amplitudes of both the analog input signal and the time sampled portion of said envelope signal by a predetermined gain factor in response to the amplitude of said sampled time portion of said envelope signal received from said first conversion means and providing a pair of output signals respectively corresponding to a gain varied analog input signal and a gain varied time sampled portion of said envelope signal;

signal normalization means coupled to said gain switching circuit means and receiving as inputs said pair of output signals, said gain varied time sampled portion of said envelope signal serving as a normalization reference signal whereupon an analog waveform output signal is generated therein corresponding to the ratio of said gain varied analog input signal to said gain varied time sampled portion of said envelope signal; and second analog to digital conversion means coupled to said signal normalization means and said first analog to digital conversion means being responsive to said waveform output signal and operated in timed relationship with said first analog to digital conversion means by said timing control signal to provide a separate and distinct second digital output word time related to said first digital output word and corresponding to said waveform signal;

said first and second digital output words being adapted to be multiplied together to provide a digital version of said analog input signal.

2. The combination as defined in claim 1 wherein:

said input signal means additionally includes signal rectifier means; and said circuit means comprises an envelope detector.

3. The combination as defined by claim 2 wherein said signal rectifier means comprises full wave rectifier means.

4. The combination as defined by claim 2 wherein said first analog to digital conversion means comprises a successive approximation analog to digital converter including signal sampling means.

5. The combination as defined by claim 2 wherein said analog input signal normalization means comprises a voltage divider network coupled between said gain varied time sampled analog envelope signal and a point of reference potential for providing a plurality of voltage reference levels, a plurality of dual input voltage comparator circuits each having one input commonly coupled to the gain varied rectified analog input signal and the other input to a separate reference voltage level of said voltage divider network and providing respective output signals from said comparator circuits corresponding to the ratio of the rectified analog input signal to fractional parts of said sampled analog envelope signal.

6. The signal converter as defined by claim 5 wherein said second analog to digital conversion means includes digital latch circuit means coupled to the respective outputs of said plurality of voltage comparator circuit means and additionally including circuit means for being selectively enabled by said timing control signal from said first analog to digital converter, and digital encoder circuit means coupled to said digital latch circuit means for generating said second digital output word.

7. The converter as defined by claim 6 wherein said digital encoder comprises a two's complement encoder.

8. The converter as defined by claim 7 and additionally including synchronized delay register means, selectively enabled by said control circuit of said first analog to digital converter means, coupled to the output of said two's complement encoder.

9. The converter as defined by claim 1 wherein said detector circuit means comprises an averaging detector circuit.

* * * * *